United States Patent
Lee et al.

(10) Patent No.: US 7,701,135 B2
(45) Date of Patent: Apr. 20, 2010

(54) ORGANIC ELECTROLUMINESCENT DEVICE WITH TWO ELECTRICALLY CONNECTED CONDUCTIVE LAYERS RESPECTIVELY DISPOSED ON DIFFERENT SUBSTRATES

(75) Inventors: Hsin-Hung Lee, Taipei (TW); Kuan-Long Wu, Kaohsiung Hsien (TW)

(73) Assignee: AU Optronics Corp., Hsinchu (TW)

( * ) Notice: Subject to any disclaimer, the term of this patent is extended or adjusted under 35 U.S.C. 154(b) by 833 days.

(21) Appl. No.: 11/517,306

(22) Filed: Sep. 8, 2006

(65) Prior Publication Data

US 2010/0066715 A1    Mar. 18, 2010

(30) Foreign Application Priority Data

Dec. 20, 2005    (TW) .................................. 94145346

(51) Int. Cl.
*H05B 33/04* (2006.01)
*H05B 33/00* (2006.01)
*H01L 21/56* (2006.01)
*H01J 1/62* (2006.01)

(52) U.S. Cl. ...................... 313/506; 313/504; 313/512; 250/214.1; 257/E27.111; 257/72

(58) Field of Classification Search ......... 313/501–512; 257/49; 315/169.3
See application file for complete search history.

(56) References Cited

U.S. PATENT DOCUMENTS

| | | | | |
|---|---|---|---|---|
| 4,360,564 A | * | 11/1982 | Philipp | 428/336 |
| 2004/0080474 A1 | * | 4/2004 | Kimura | 345/82 |
| 2004/0201348 A1 | * | 10/2004 | Anandan | 313/512 |
| 2004/0227459 A1 | * | 11/2004 | Imura | 313/504 |
| 2004/0262605 A1 | | 12/2004 | Park et al. | |
| 2005/0247936 A1 | * | 11/2005 | Bae et al. | 257/59 |
| 2006/0125407 A1 | * | 6/2006 | Jeong | 315/169.3 |

\* cited by examiner

*Primary Examiner*—Sikha Roy
*Assistant Examiner*—Tracie Green
(74) *Attorney, Agent, or Firm*—Birch, Stewart, Kolasch & Birch, LLP

(57) ABSTRACT

An organic electroluminescent device comprises two substrates facing to each other. The first substrate has a first conductive layer and a pixel array. A second substrate is located on the pixel array, and has a second conductive layer on its lower surface. The pixel array includes a plurality of organic light emitting diodes connected to the first conductive layer. The second conductive layer is electrically connected to the conductive layer, and then electrically connected to a voltage source by way of the first conductive layer.

17 Claims, 7 Drawing Sheets

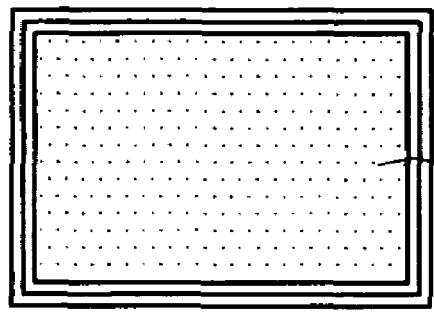 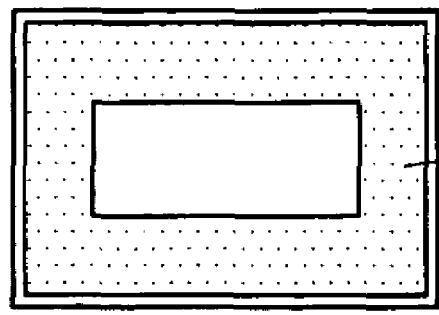
FIG.9A  FIG.9B
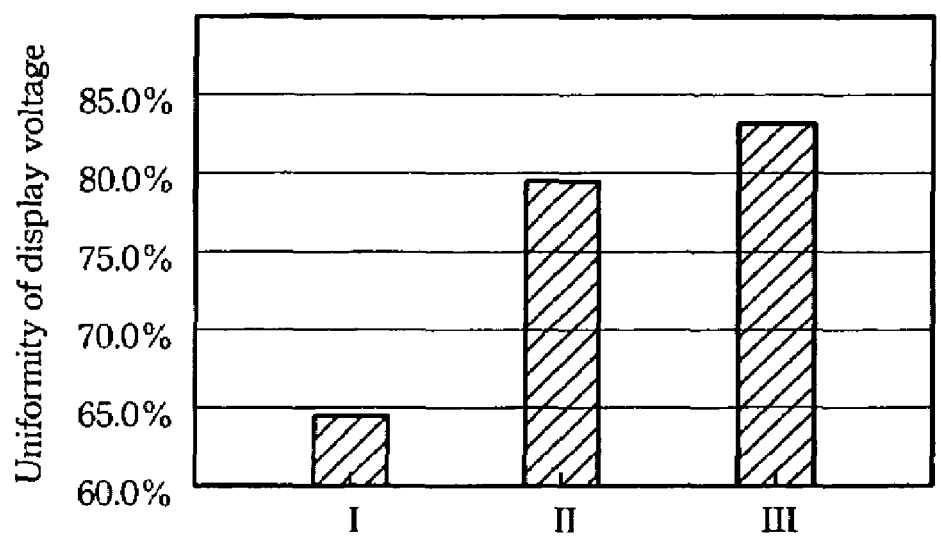
FIG.10

ORGANIC ELECTROLUMINESCENT DEVICE WITH TWO ELECTRICALLY CONNECTED CONDUCTIVE LAYERS RESPECTIVELY DISPOSED ON DIFFERENT SUBSTRATES

This application claims the benefit of Taiwan Patent Application Serial No. 094145346, filed Dec. 20, 2005, the subject matter of which is incorporated herein by reference.

BACKGROUND OF THE INVENTION (1) Field of the Invention

The present invention relates to an organic electroluminescent device with uniform driving current.

(2) Description of the Related Art

Organic electroluminescent panels use organic light emitting diodes as light sources. The organic light emitting diodes belongs to current-driving elements which change brightness with electric current flowing through the organic light emitting diode. Therefore, it is important to precisely control the electric current to flow through organic light emitting diode.

FIG. 1A shows a circuit diagram of a pixel array in a conventional active organic light emitting panel. FIG. 1B shows a plane diagram of one pixel of the pixel array in FIG. 1A. Each of pixel units 10 includes an organic light emitting diode 11, a switching transistor 12, a driving transistor 13, a data-line 14, a scan line 15, a power line 16 and a capacitor 17. Their connections have been obvious to one having ordinary skill in the art.

All driving transistors 13 of the pixel array are connected to a common display voltage source $V_{DD}$ with either source electrodes or drain electrodes, in order to generate a display voltage level. The source electrodes or drain electrodes, which are not connected to the display voltage source $V_{DD}$, are connected to the organic light emitting diodes 11. The organic light emitting diode 11 has one end connected to the driving transistor 13, and the other end connected to the ground electrode or a reference voltage source Vss to get a reference voltage level. The difference between the display voltage level and the reference voltage level cooperates with the data voltage input from the data line 14 to effect the electric current flowing through the organic light emitting diode 11, in order to control the brightness.

Generally, the reference voltage level is constant, so the stability of the display voltage level affects the difference between the display voltage level and the reference voltage level. However, as the electric current which is applied by the display voltage source $V_{DD}$ goes to different pixel units by way of the power line 16, the different IR drops happen due to the factors such as materials, thickness of the power line 16, pathway of electric current, or distance from each pixel unit to the display voltage source $V_{DD}$. Therefore, the practical operating voltage of the pixel unit is different from the voltage applied by the display voltage source $V_{DD}$. The result are that unstable electric current occurs and flows through the organic light emitting diode 11 of each pixel unit, and that brightness is hard to control.

For improving the above disadvantage, the thickness of the metal wire such as data line, scan line or power line etc., is increased to prevent the unstable electric current. For example, the thickness of the power line 16 is increased to stabilize the electric current which flows through the source electrode or the drain electrode of the driving transistor 13.

Refer to FIG. 1C, buffer layers 131, such as silicon nitride or silicon oxide, gate oxide layer 132, dielectric layer 133, metal layer 134, protecting layer 135 and flat layer 136 etc., are disposed on the substrate 130. The metal layer 134 acts as the source/drain electrode of the transistor 13, and has a thickness reaching to 6000 Å.

Refer to FIG. 1D, the ordinate is uniformity of the display voltage (%), and the abscissa is the thickness of the metal layer (Å). In average, as the thickness of the metal layer 134 is increased from 2000 Å to 6000 Å, the uniformity of the display voltage is increased from 78% to 88%. Therefore, the electric resistance and IR drop can be reduced by increasing the thickness of the metal layer.

However, the increased thickness of the metal layer results in the following issues: the time and cost in PVD or etching process increase; high step coverage ability requirement or a flat process employed due to the ITO layer and the protecting layer 135 fabricated in the latter process; corrosion happening in the latter process due to the sidewall of the metal layer 134 covered incompletely; the structure peeling off due to larger stress.

SUMMARY OF THE INVENTION

The object of the present invention is to provide an organic electroluminescent panel, which can improve the disadvantages of the prior art and avoid the driving current of the organic light emitting diode changing with flowing distance due to the IR drop happening.

In one aspect of the present invention, the organic electroluminescent device comprises two substrates facing to each other. A first substrate has a first conductive layer and a pixel array. A second substrate is located on the pixel array, and has a second conductive layer on its lower surface. The pixel array includes a plurality of organic light emitting diodes connected to the first and second conductive layers. The second conductive layer is electrically connected to the first conductive layer, and then electrically connected to a voltage source by way of the first conductive layer. The electric current input from the voltage source can go to any one pixel unit by way of a lower resistant pathway selected from the first conductive layer and the second conductive layer. That make the practical operating voltage of the pixel unit approach to the voltage of the display voltage source.

The second conductive layer and the first conductive layer are disposed on different substrates, so the disadvantages such as corrosion, step coverage and peeling off etc., can be avoided due to increasing the thickness of the first conductive layer like power line etc. The second conductive layer can be made from materials with better conductivity than the first conductive layer to aid the electric current in flowing to the organic light emitting diode which is far away from the voltage source. Therefore, the present invention can provide a simplified process.

BRIEF DESCRIPTION OF THE DRAWINGS

The present invention will now be specified with reference to its preferred embodiment illustrated in the drawings, in which

FIGS. 9A-9B show a plane diagram of a distribution region of the second conductive layer; and FIG. 10 shows the improvement about uniformity of the display voltage level according to the present invention.

DESCRIPTION OF THE PREFERRED EMBODIMENT

Figure 1A:
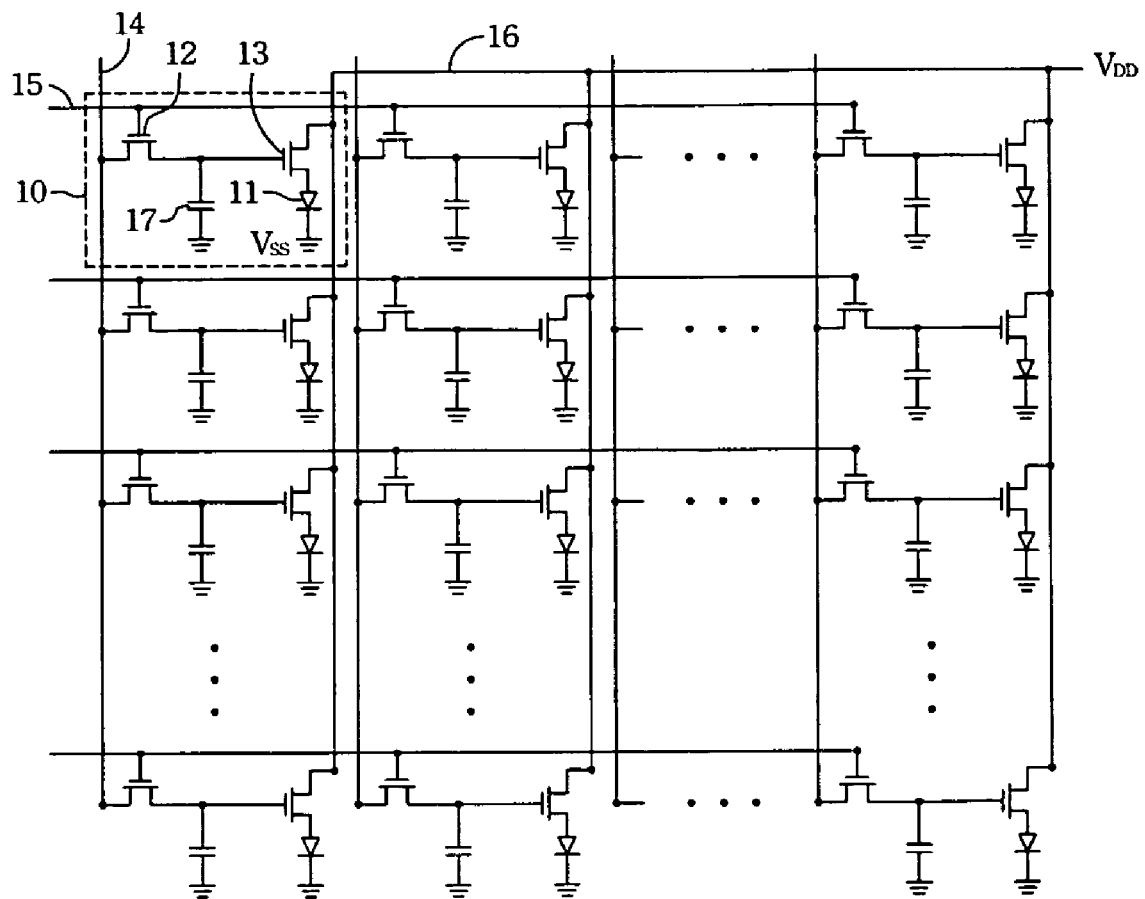
FIG. 1A shows a circuit diagram of a pixel array in the conventional organic electroluminescent display.
Figure 1B:
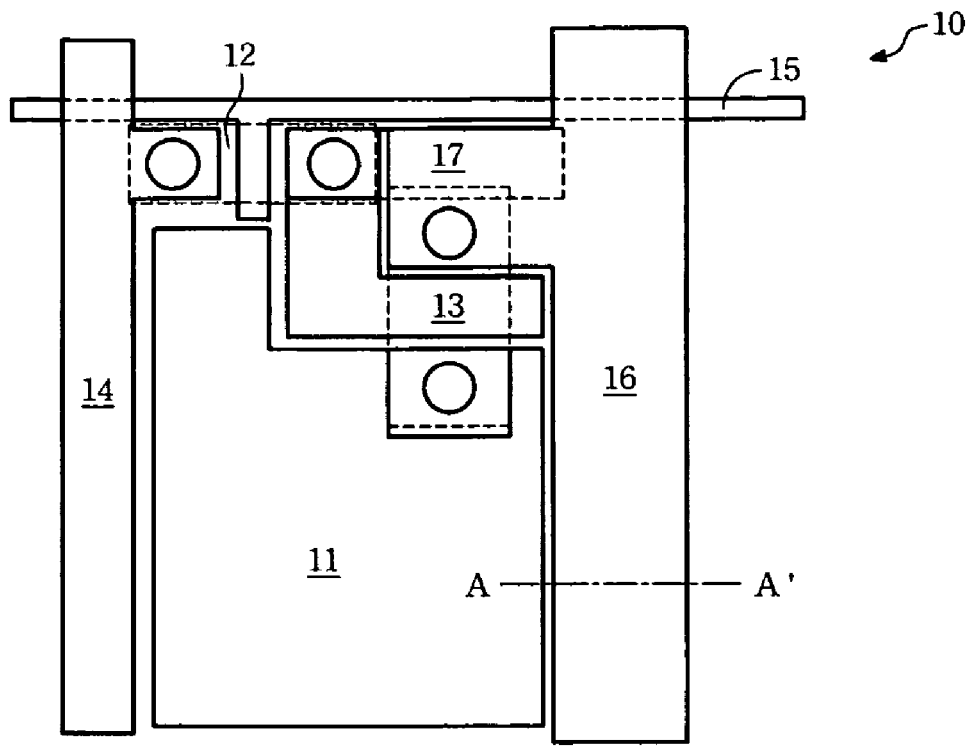
FIG. 1B shows a plane diagram of a pixel unit of the pixel array shown in FIG. 1A.
Figure 1C:
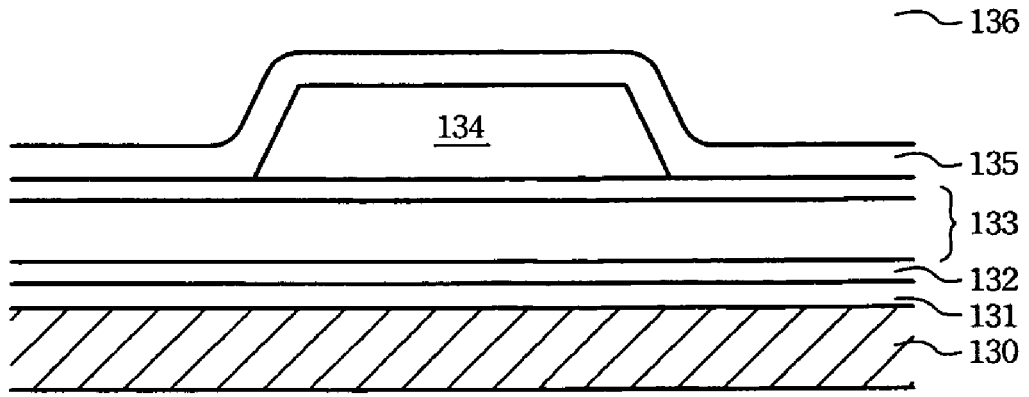
FIG. 1C shows a sectional view along A-A line shown in FIG. 1B.
Figure 1D:
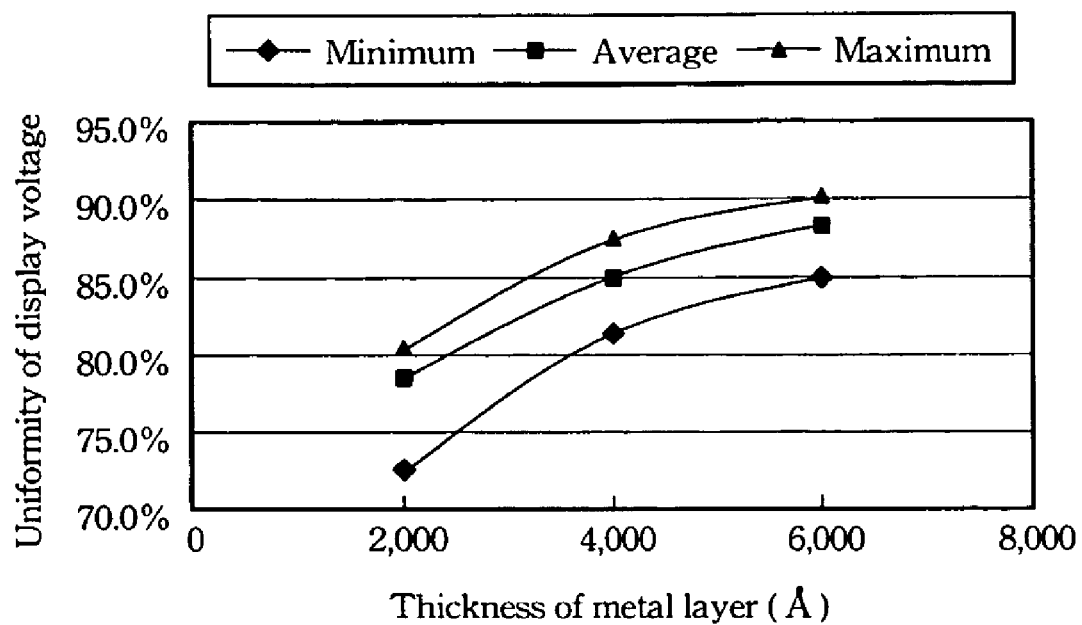
FIG. 1D shows relation curves between the uniformity of the display voltage level and the thickness of the metal layer in the conventional organic electroluminescent display.
Figure 2:
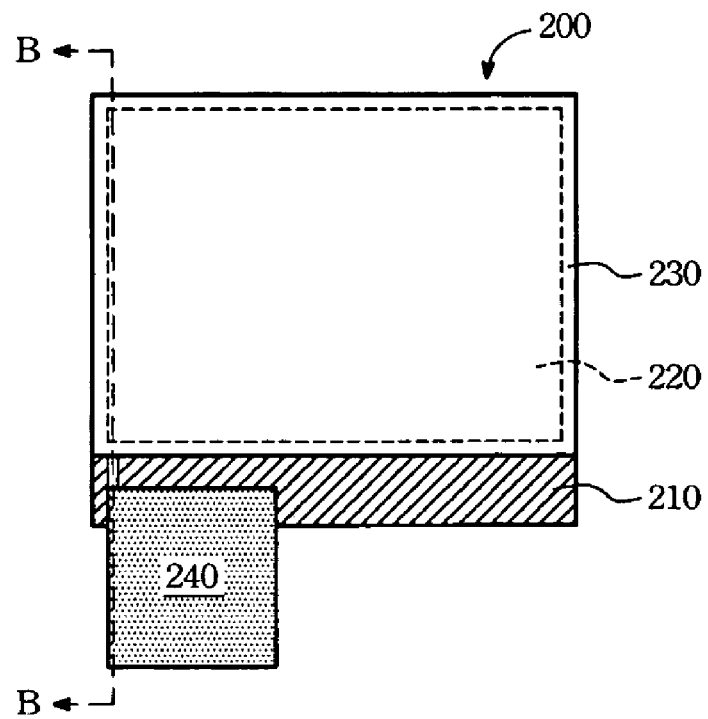
FIG. 2 shows a top view of an organic electroluminescent panel according to the present invention.

Refer to FIG. 2, the organic electroluminescent display 200 includes a first substrate 210 and a second substrate 220. The first substrate 210 is adhered to the second substrate 220 via a adhering area 230. The first substrate 210 is below the second substrate 220, and connected with a flexible printed board 240. The second substrate 220 can be served as a package lid to protect the circuit on the first substrate 210.

Figure 3:
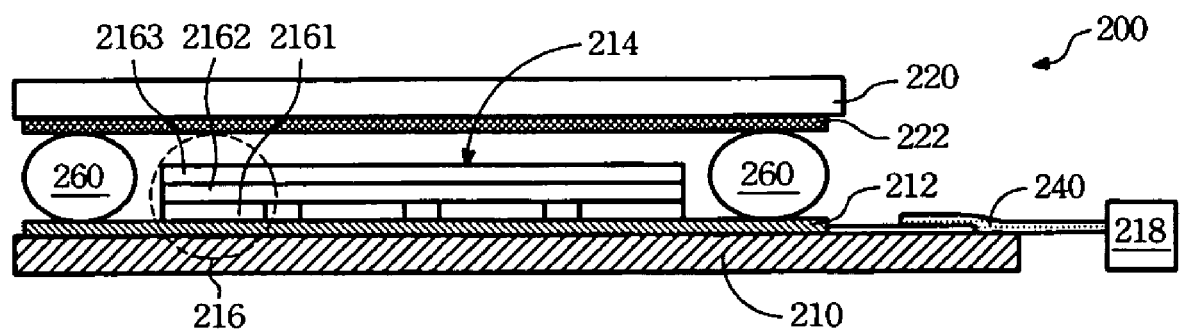
FIG. 3 shows a sectional view along B-B line shown in FIG. 2 according to the present invention.

Refer to FIG. 3, the upper surface of the first substrate 210 is disposed with a first conductive layer 212 and a pixel array 214. The second substrate 220 is disposed on the pixel array 214, and has a second conductive layer 222 which is electrically connected to the first conductive layer 212. The pixel array 214 includes a plurality of organic light emitting diodes 216 connected to the first conductive layer 212. The first conductive layer 212 is electrically connected to a voltage source 218 through the flexible circuit broad 240. Thus, the electric current can select a path from the first conductive layer 212 or second conductive layer 222 which has lower resistance to transport from the voltage source 218 to any one organic light emitting diode 216 of the pixel array 214.

As shown in FIG. 3, the first electrode 2161 of the organic light emitting diode 216 is electrically connected to the driving transistor (not shown) of the pixel unit, further connected to the first conductive layer 212 to receive the electric current from the voltage source 218. Subsequently, organic layers 2162 such as hole injecting layers, hole transporting layers, light emitting layers, electron transporting layers and electron injecting layers, are formed on the first electrode 2161. The second electrode 2163 is formed on the organic layers 2162. The materials of the organic layers 2162 can refer to the relative published documents in the art. In one aspect of an active panel, the pixel array 214 includes a plurality of transistors (not shown) to act as drivers or switches of the organic light emitting diode 216.

As shown in FIG. 3, the first conductive layer 212 can be electrically connected to the second conductive layer 222 by means of contacting directly or adhering with a contact pad 260. The first and second conductive layers 212, 222 can be made from ITO, Al, Cr, Ti, Mo, Ag, Cu or their combinations. The contact pad 260 can be disposed on the lower surface of the first substrate 210 or the lower surface of the second substrate 220, and be made of a mixture of adhesive and conductive materials, silver pastes, solders or anisotropic conductive films (ACF) etc. In the embodiment, the contact pad 260 is made from a sealant mixed with conductive balls, which can package the two substrates 210 and 220 together and form electrically conduction between the first and second conductive layers 212 and 222.

Figure 4:
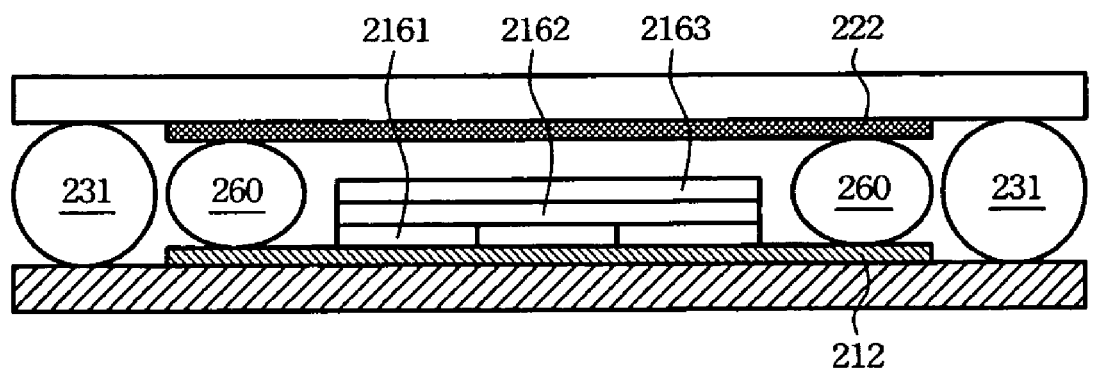
FIG. 4 shows a second preferable embodiment according to the present invention.

Refer to FIG. 4, the substrate 210 is adhered to the substrate 220 at their peripheral portions. The contact pad 260 is disposed near the inside of the sealant 231, and used to conduct between the conductive layers 212 and 222. Note that the contact pad 260 does not always combine function of packaging. In the embodiment, the contact pad 260 can be made from silver paste, solder ball or ACF, but not mix with adhesives.

Figure 5:
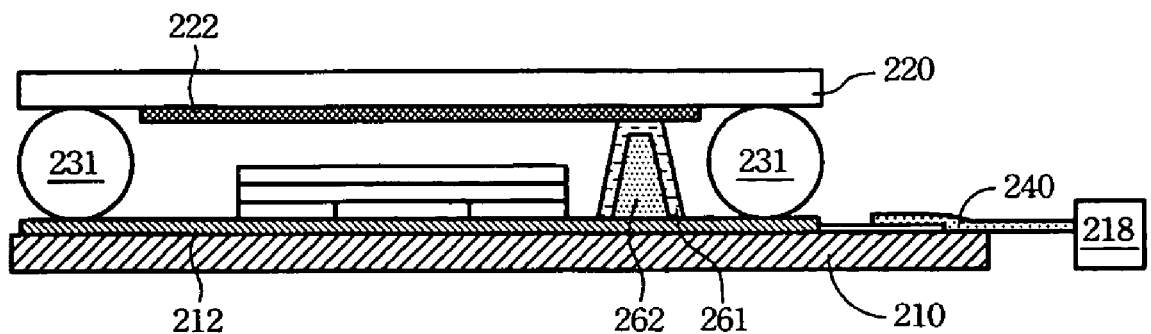
FIG. 5 shows a third preferable embodiment according to the present invention.

Refer to FIG. 5, the contact pad 260 is an island structure formed by an insulating protrusion covered with a third conductive layer 261. The third conductive layer 261 can be made from ITO, Al, Cr, Ti, Mo, Ag, Cu, Pd or their combinations. The insulating protrusion 262 can be made from light-sensitive organic resin, hard resin or soft resin. In the embodiment, the first, second and third conductive layers 212, 222, 261 are made from different materials. The insulating protrusion 262 can be formed on the first conductive layer 212. In addition, the third conductive layer 261 can be formed integrally with the first conductive layer 212 or the second conductive layer 222, refer to FIGS. 7A-7C.

Figure 6:
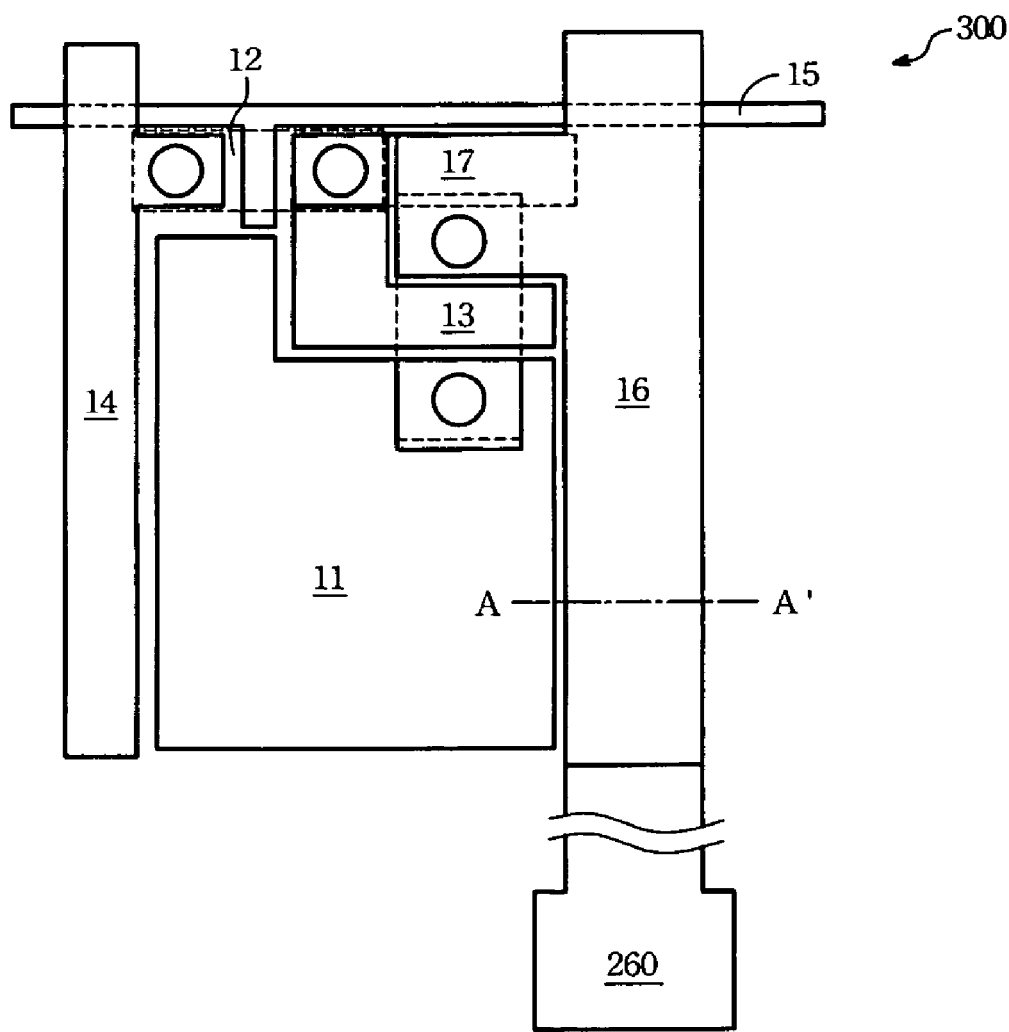
FIG. 6 shows a plane diagram of a pixel unit of the organic electroluminescent panel according to the present invention.

Refer to FIG. 6, the first conductive layer 212 is served as the power line 16 of the pixel unit 300, and has a thickness ranging from 100 Å to 6000 Å. The power line 16 is electrically connected to the contact pad 260. FIG. 6 shows the connection between the driving transistor 13, the power line 16 and the contact pad 260. FIGS. 3, 4, 5, and 7A-7C show the types of the contact pad 260.

Figure 7A:
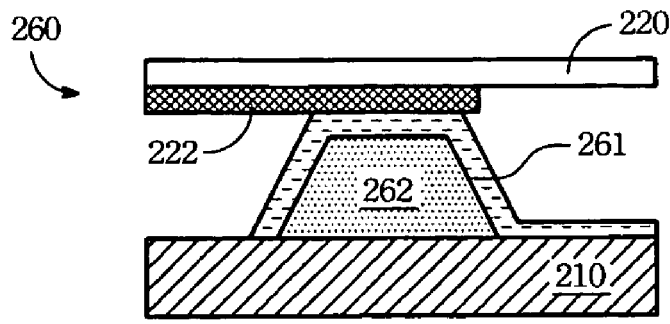
FIGS. 7A-7C show a variety of contact pads having island structures.
Figure 7B:
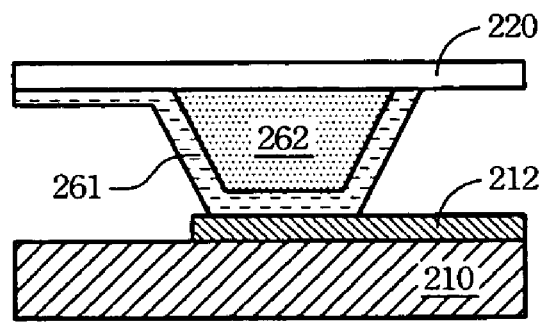
Figure 7C:
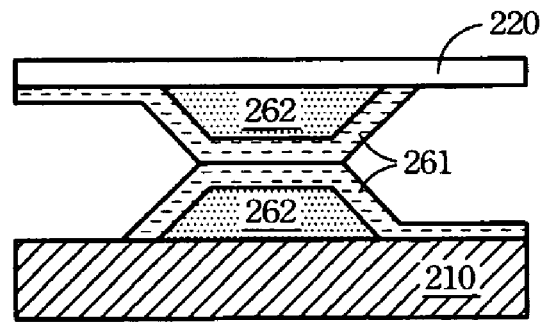

FIGS. 7A-7C show the contact pad with island structure. When the third conductive layer 261 and the first conductive layer 212 shown in FIG. 5 are made from the same materials and formed integrally with each other in the same process, the result structure is shown in FIG. 7A. In this way, a root portion of the insulating protrusion 262 is formed on the first substrate 210 directly. And the third conductive layer 261 is electrically connected to not only the second conductive layer 222, but also the voltage source and the organic light emitting diode.

The third conductive layer 261 and the second conductive layer 222 are formed integrally as the structure shown in FIG. 7. Accordingly, the root portion of the insulating protrusion 262 can be disposed on the lower surface of the second substrate 220. And the third conductive layer 261 can function as the second conductive layer 222 shown in FIG. 5.

Refer to FIG. 7, each contact pad includes two island structures, the root portions of which are disposed on the upper surface of the first substrate 210 and on the lower surface of the second substrate 220, respectively. The top portions of the two islands correspond to and contact with each other. Accordingly, the two contacted third conductive layers 261 can replace the first conductive layer 212 and the second conductive layer 222, respectively.

Figure 8A:
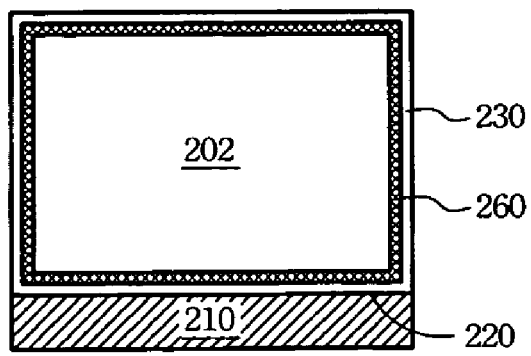
FIGS. 8A-8B show a plane diagram of a distribution region of the contact pads.
Figure 8B:
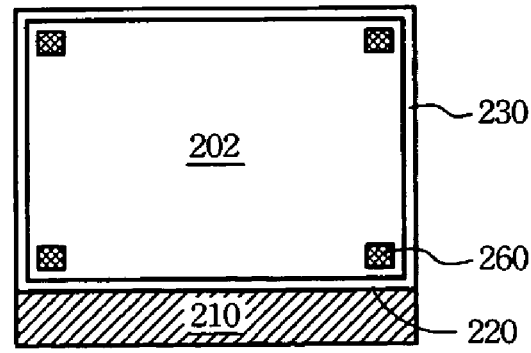

Refer to FIG. 8A, the overlap between two substrate 210 and 220 includes the active area 202 and an adhering area 230 enclosing the active area 202. The contact pads 260 are disposed as band type along the inside of the adhering area 230 to enclose the active area 202 of the organic electroluminescent display 200. Refer to FIG. 8B, a plurality of contact pads 260 separated from each other can be also disposed in the active area 202. It is note that the contact pads 260 should be disposed at one side of the substrate near the voltage source and at the other side far from the voltage source. Therefore, the electric current can input to the target organic light emitting diode by flowing from the near contact pad 260 through the second substrate 220 to the far contact pad 260, and return to the first substrate 210.

Refer to FIG. 9A, the second conductive layer 222 is formed on the entire surface of the package lid or the second substrate 220. Refer to FIG. 9B, the second conductive layer 222 can be patterned as bus-line or other types. The second conductive layer 222 has a thickness larger than 2000 Å, and is formed by electric plating to cover on the package lid.

By the way, the contact pads 260 formed with forgoing materials, types and positions can be applied to the organic electroluminescent display. Preferably, the second conductive layer 222 has a lower resistance than the first conductive layer 212.

Refer to FIG. 10, the ordinate is the uniformity of the display voltage (%), and the abscissa is three sets of operating condition. In following operating conditions, SD represents that a metal wire which is connected to source/drain electrode, and has three metal sub-layers like Ti/Al/Ti complex layer. The operating condition set I is SD: Ti/Al/Ti=500 Å/2000 Å/1000 Å. The operating condition set II is SD: Ti/Al/Ti=500 Å/4000 Å/1000 Å. The operating condition set III is SD: Ti/Al/Ti=500 Å/2000 Å/1000 Å, and a conductive layer with 2000 Å in thickness disposed on the upper substrate or the package lid. Comparing the condition set I and II, as the thickness of the metal wire of the source/drain electrode is increased, the uniformity of the display voltage is increase, but the disadvantages of the prior art still exist. Comparing the condition set I and III, instead of increasing the thickness of the metal wire of the source/drain electrode, the conductive layer with 2000 Å thickness is disposed on the package lid. It proves that the structure disclosed in the present invention can create higher uniformity of the display voltage and be fabricated more easily.

The advantages of the present invention are as follows. A) The thickness of the first conductive layer can be reduced. B) There are no limitations in the thickness of the second conductive layer. C) The brightness is more uniform.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. An organic electroluminescent panel, comprising:
   a first substrate;
   a first conductive layer, disposed on the first substrate;
   a pixel array, disposed on the first substrate, and including a plurality of organic light emitting diodes electrically connected to the first conductive layer;
   a second substrate, disposed on the pixel array;
   a second conductive layer, disposed on the lower surface of the second substrate, and electrically connected to the first conductive layer;
   a voltage source, electrically connected to the first conductive layer; and
   a contact pad disposed between the first and second substrates to electrically connect the first conductive layer with the second conductive layer, wherein the contact pad includes two island structures having root portions disposed on the lower surface of the second substrate and the upper surface of the first substrate, respectively, and having top portions correspond to and contact with each other.

2. The organic electroluminescent panel of claim 1, wherein the pixel array includes a plurality of thin film transistors electrically connected to the organic light emitting diodes.

3. The organic electroluminescent panel of claim 1, wherein the contact pad includes a third conductive layer covering an insulating protrusion.

4. The organic electroluminescent panel of claim 3, wherein the third conductive layer is made from a material selected from the group consisting of ITO, Al, Cr, Ti, Mo, Ag, Pd and combination thereof.

5. The organic electroluminescent panel of claim 1, wherein the second substrate is a package lid.

6. The organic electroluminescent panel of claim 1, wherein the thickness of the second conductive layer is equal to or larger than 2000 Å.

7. The organic electroluminescent panel of claim 1, wherein the thickness of the first conductive layer ranges from 100 Å to 6000 Å.

8. The organic electroluminescent panel of claim 1, further including a flexible circuit board electrically connected the voltage source with the first conductive layer.

9. The organic electroluminescent panel of claim 1, wherein the second conductive layer has lower electrical resistance than the first conductive layer.

10. The organic electroluminescent panel of claim 1, wherein the second conductive layer is made from a material selected from the group consisting of ITO, Al, Cr, Ti, Mo, Ag, Cu and combination thereof.

11. The organic electroluminescent panel of claim 1, wherein the first conductive layer is electrically connected to the second conductive layer through an anisotropic conductive film (ACF).

12. The organic electroluminescent panel of claim 1, wherein the first conductive layer is electrically connected to the second conductive layer through a solder.

13. The organic electroluminescent panel of claim 1, wherein the first conductive layer contacts with the second conductive layer directly.

14. The organic electroluminescent panel of claim 1, wherein the first conductive layer is electrically connected to the second conductive layer through an adhesive which is mixed with a metal ball.

15. A organic electroluminescent display panel, comprising;
   a substrate;
   a first conductive layer, disposed on the substrate;
   a pixel array, disposed on the substrate, and including a plurality of organic light emitting diodes electrically connected to the first conductive layer;
   a package lid, disposed on the pixel array; and
   a second conductive layer, disposed on the surface of the package lid, and electrically connected to a plurality of contact pads, wherein the contact pads are electrically connected to the first conductive layer and each of the contact pads includes two island structures having root portions disposed on the lower surface of the second substrate and the upper surface of the first substrate respectively and having top portions correspond to and contact with each other.

16. The organic electroluminescent panel of claim 15, wherein the pixel array includes a plurality of thin film transistors electrically connected to the organic light emitting diodes.

17. The organic electroluminescent panel of claim 15, wherein each of the contact pads includes a third conductive layer covering an insulating protrusion.

* * * * *